United States Patent
Fleming et al.

(10) Patent No.: US 9,084,354 B2
(45) Date of Patent: Jul. 14, 2015

(54) METHOD OF MANUFACTURING A SUBSTRATE HAVING A VOLTAGE SWITCHABLE DIELECTRIC MATERIAL

(75) Inventors: Robert Fleming, San Jose, CA (US);
Lex Kosowsky, San Jose, CA (US);
Shurui Shang, San Jose, CA (US);
Bhret Graydon, San Jose, CA (US);
Xiaofeng Chen, San Jose, CA (US);
Glen Irvin, San Jose, CA (US)

(73) Assignee: LITTELFUSE, INC., Chicago, IL (US)

( * ) Notice: Subject to any disclaimer, the term of this patent is extended or adjusted under 35 U.S.C. 154(b) by 305 days.

(21) Appl. No.: 13/597,152

(22) Filed: Aug. 28, 2012

(65) Prior Publication Data
US 2012/0318569 A1  Dec. 20, 2012

Related U.S. Application Data

(63) Continuation of application No. 13/009,802, filed on Jan. 19, 2011, now Pat. No. 8,272,123, which is a continuation-in-part of application No. 12/694,702, filed on Jan. 27, 2010, now Pat. No. 8,399,773.

(60) Provisional application No. 61/147,730, filed on Jan. 27, 2009.

(51) Int. Cl.
| H05K 3/10 | (2006.01) |
| H05K 1/02 | (2006.01) |
| H05K 1/03 | (2006.01) |
| H05K 3/00 | (2006.01) |

(52) U.S. Cl.
CPC ............ *H05K 1/0259* (2013.01); *H05K 1/0271* (2013.01); *H05K 1/036* (2013.01); *H05K 1/0373* (2013.01); *H05K 3/0005* (2013.01); *H05K 2201/068* (2013.01); *H05K 2201/0738* (2013.01); *H05K 2201/09136* (2013.01); *Y10T 29/4913* (2015.01); *Y10T 29/49117* (2015.01); *Y10T 29/49124* (2015.01); *Y10T 29/49155* (2015.01); *Y10T 156/10* (2015.01)

(58) Field of Classification Search
CPC .......... H05K 1/0259; H05K 2201/068; H05K 2201/0738; H05K 2201/09136
USPC ................................ 29/825, 829, 846; 361/56
See application file for complete search history.

(56) References Cited

U.S. PATENT DOCUMENTS

| 4,325,771 | A | * | 4/1982 | Brower et al. | ................. 156/261 |
| 4,345,895 | A | * | 8/1982 | LeFever et al. | ............... 431/359 |
| 4,394,709 | A | * | 7/1983 | Brower et al. | ................. 361/762 |
| 4,394,710 | A | * | 7/1983 | Brower et al. | ................. 361/762 |

* cited by examiner

*Primary Examiner* — Carl Arbes
(74) *Attorney, Agent, or Firm* — Kacvinsky Daisak Bluni PLLC

(57) ABSTRACT

A method for designing a printed circuit board to meet a specification is described. A first voltage switchable dielectric material is placed in apposition with a first copper foil. A second voltage switchable dielectric material is placed in apposition with a second copper foil. An arcuate portion of the first copper foil is placed in apposition with a first side of an aluminum member, an adhesive substance being situated between the first copper foil and the first side of the aluminum member. An arcuate portion of the second copper foil in is placed apposition with a second side of the aluminum member, an adhesive substance being situated between the second copper foil and the second side of the aluminum member.

6 Claims, 9 Drawing Sheets

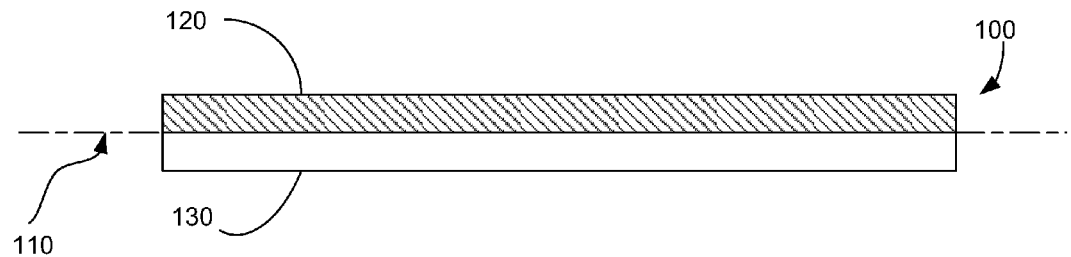
FIG. 1A
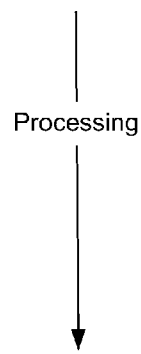
Processing
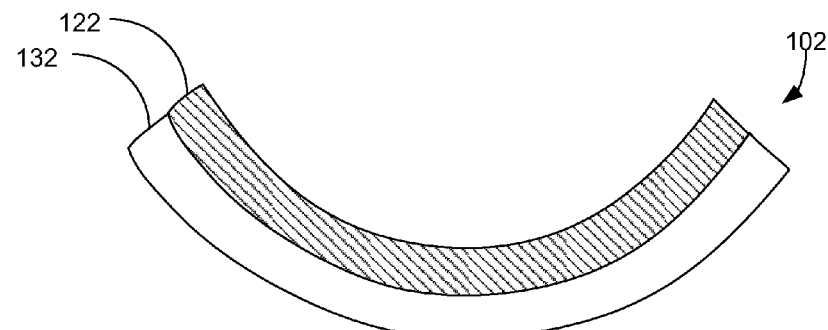
FIG. 1B
FIG. 1

Processing

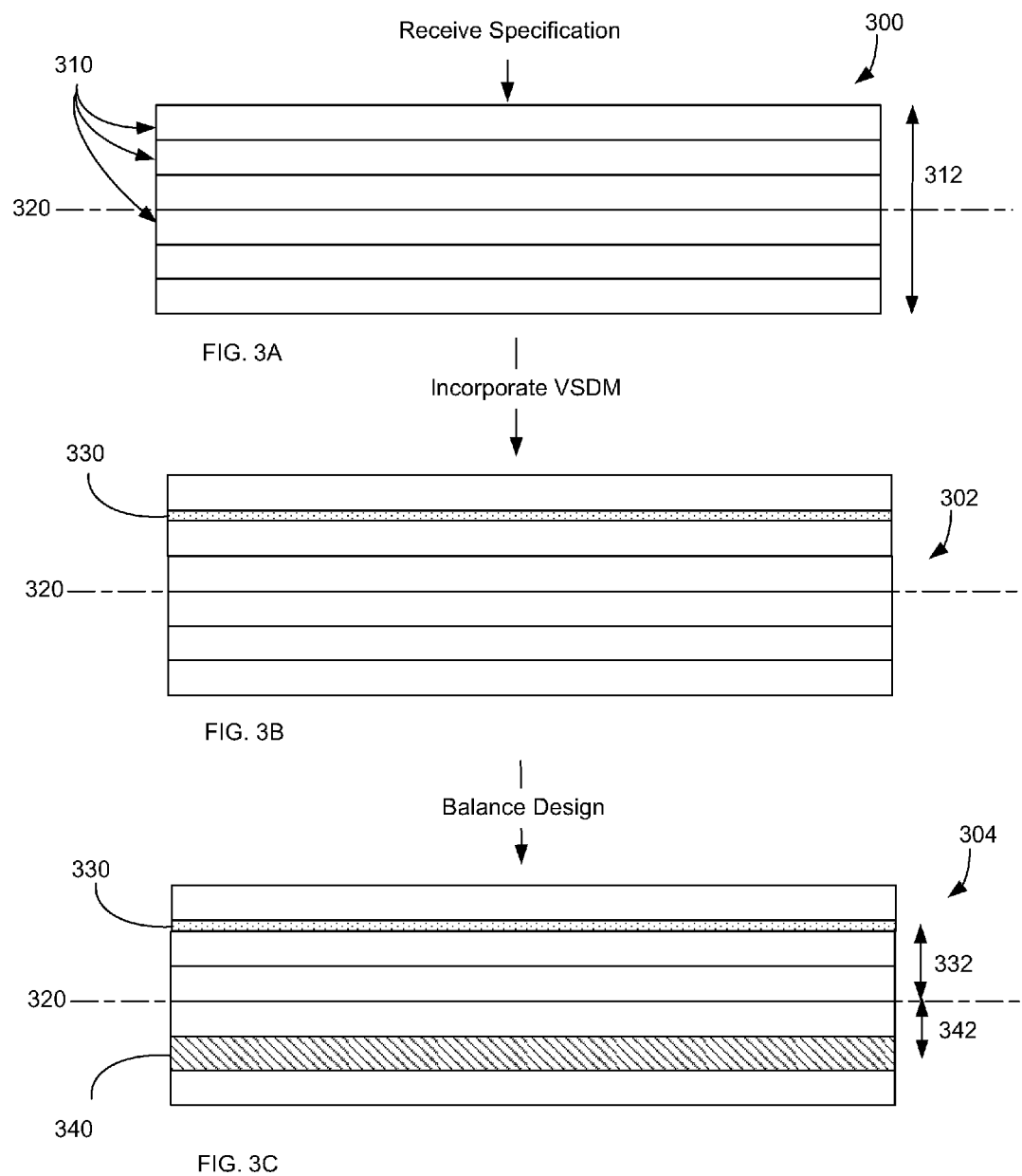

METHOD OF MANUFACTURING A SUBSTRATE HAVING A VOLTAGE SWITCHABLE DIELECTRIC MATERIAL

CROSS REFERENCE TO RELATED APPLICATIONS

This application is a continuation of U.S. patent application Ser. No. 13/009,802, filed Jan. 19, 2011 now U.S. Pat. No. 8,272,123, which is a continuation-in-part of U.S. patent application Ser. No. 12/694,702 filed Jan. 27, 2010 now U.S. Pat. No. 8,399,773, which claims the priority benefit of U.S. Provisional Patent Application No. 61/147,730, filed Jan. 27, 2009, entitled "Techniques for Reducing Warpage in the Application of VSD Material to Core and Substrate." The disclosures of all of the above mentioned applications are incorporated by reference herein.

BACKGROUND

1. Technical Field

The present invention relates to designing and fabricating objects that incorporate voltage switchable dielectric materials.

2. Description of Related Art

A printed circuit board, printed wiring board, integrated circuit (IC) package, or similar substrate (hereinafter, PCB) may be used to assemble and connect electronic components. A PCB typically includes a dielectric material and one or more conductive leads to provide electrical conductivity among various attached components, chips, and the like. In some cases, metallic leads may be included (e.g., as a layer of Cu which is subsequently etched) to provide electrical connectivity.

A typical PCB may be fabricated from reinforcements (e.g., glass fibers) that have been pre-impregnated with a matrix (e.g., a polymer resin). A matrix may be combined with (e.g. infiltrated into) the reinforcement while substantially liquid. Handling of the pre-impregnated material may be enhanced by subjecting the matrix to a partial cure (e.g., a B-stage cure) to at least partially solidify the matrix, which may at a later stage be fully cured to a C-stage. A PCB may be fabricated from one or more layers of pre-impregnated material.

A pre-impregnated material is often described as a "prepreg." Prepreg is typically available as a sheet or roll of material, and may be characterized by specifications such as grain (associated with "length" in the roll direction) and fill (associated with "width" in the roll direction). Prepreg may be characterized by various other specifications, such as dimensions (e.g., uncured thickness, cured thickness, and the like), reinforcement material (e.g., glass fibers having a diameter), weave pattern (e.g., of the fibers), matrix composition (e.g., resin composition, % matrix, fillers, and the like), curing protocols, and the like. A type of prepreg may be characterized by a "style," which may summarize one or many parameters describing the prepreg. A style may include a description of the reinforcement type (e.g., woven glass), strand size, weave configuration, density, and the like. Exemplary standard styles include 106, 1080, 2313, 2116, 7628, and the like.

PCB fabrication may include choosing one or more layers of prepreg, stacking the layers, and curing the stacked layers (often with pressure) to form a solid substrate. Vias and/or leads may be incorporated on and/or within a PCB. Prepreg often shrinks during curing, typically in a predictable fashion, and expected shrinkage may be incorporated into a PCB specification. Many prepreg materials are anisotropic, particularly with respect to dimensional changes (e.g., during curing). Dimensional changes may be different in the grain direction than in another direction (e.g., the fill direction).

Many prepreg materials are characterized with one or more specifications for "artwork compensation," which may describe an expected shrinkage during curing. Specifications for artwork compensation are often sufficiently controlled and predictable that they may be incorporated into the PCB design. The artwork compensation specification for a PCB fabricated from a stack of prepregs may often be calculated from the individual prepreg specifications, orientations, and stacking order of the prepreg layers.

A substrate, particularly a thin substrate, may be warped, bent, or otherwise deformed by various processes. In some cases, a substrate may be inadvertently deformed during processing (e.g., during curing of a PCB). A substrate may be warped by external forces. A substrate may be warped by internal elastic forces (e.g., a thermal expansion mismatch between materials).

Viewed in cross-section (i.e., viewing parallel to the plane of a PCB), a PCB may be characterized by a centerline. Typical PCB stacks are designed to be mechanically "balanced" with respect to the centerline, such that forces (e.g., induced during curing and/or cooling from high temperature) above the centerline are cancelled or otherwise opposed by equivalent forces below the centerline. For example, a prepreg layer with a first grain orientation and a first distance above the centerline may be balanced by an equivalent layer having the same grain orientation located the same distance below the centerline. Balancing is often achieved by creating a symmetrical prepreg stack with respect to the centerline. In some cases, the centerline may represent a line of mirror symmetry (at least with respect to mechanical and/or thermal properties), with layers above the centerline being balanced by corresponding "mirror" layers below the centerline.

Various electrical and electronic components may benefit from surge protection, such as protection against electrostatic discharge (ESD) and other electrical events. ESD protection may include incorporating a voltage switchable dielectric material (VSDM). A VSDM may behave as an insulator at a low voltage, and a conductor at a higher voltage. A VSDM may be characterized by a so-called "switching voltage" between these states of low and high conductivity. A VSDM may provide a shunt to ground that protects a circuit and/or component against voltages above the switching voltage by allowing currents at these voltages to pass to ground through the VSDM, rather than through the device being protected.

Many VSDM materials are polymer-based, and may include filled polymers. Processing a VSDM layer on a PCB may cause warping, which may be undesirable. Controlling dimensional changes (e.g., maintaining planarity) may improve the processing of devices incorporating a VSDM, and particularly a layer of VSDM on a thin substrate (whose dimensions may be altered by stress in the VSDM).

FIGS. 1A and 1B illustrate an exemplary unbalanced substrate (e.g., an unbalanced PCB). An unbalanced PCB 100 may be characterized by a centerline 110. A first portion 120 of the PCB (above centerline 120) may not be balanced by a corresponding second portion 130 of the PCB (below centerline 110). In some cases, imbalance may not be manifest until subsequent processing (e.g., curing the PCB and/or cooling from a curing temperature above room temperature). In the example shown in FIG. 1B, PCB 102 has been processed. In processed PCB 102, first portion 122 may have a higher shrinkage (e.g., during curing or cooling) than second portion 132, resulting in warpage of the processed PCB 102.

Voltage switchable dielectric materials may have thermal, elastic, plastic, viscous, and other properties that are different than those of typical prepreg layers. Incorporating a VSDM into a prepreg stack may result in an unbalanced substrate. During various processing steps, imbalance in a substrate may be manifest as loss of dimensional control (e.g., warpage of a PCB).

SUMMARY OF THE INVENTION

Various aspects provide for the incorporation of a voltage switchable dielectric material into a substrate in a manner that results in the substrate meeting various specifications, including dimensionality specifications. In some embodiments, a method for designing a PCB to meet a specification may comprise choosing a first design for a PCB comprising one or more prepreg layers. A first region comprising a VSDM may be incorporated into the first design to create an ESD-protected design. A balance region may be identified, whose incorporation into the ESD-protected design is expected or predicted to balance an imbalance induced by the incorporation of the first region. The balance region may be incorporated into the ESD-protected design to create a balanced, ESD-protected design.

Some designs may be substantially planar (e.g., sufficiently planar to meet a planarity specification or perform in a desired manner). Some designs include a centerline. Certain embodiments include a prepreg stack that does not display mirror symmetry with respect to a centerline associated with the prepreg stack. Some aspects include a balanced, ESD-protected PCB (and or PCB design) that does not have mirror symmetry with respect to a centerline associated with the ESD-protected design.

A first region incorporating a VSDM may be disposed on the same side of the centerline as a balance region. The first region may be on the opposite side of the balance region. The balance region may be on the same side as the first region and opposite side of the centerline. In some cases, a balance region may be disposed a greater distance from the centerline than the first region.

Incorporating a balance region may include adding or subtracting a prepreg layer from a prepreg stack. Incorporating a balance region may include adding a first and subtracting a second prepreg layer from a prepreg stack. In some cases, a balance region comprises a plurality of separate regions. An added prepreg layer may be a different style, thickness, grain orientation, resin content, reinforcement, weave, and/or different in other ways. An added prepreg layer may be the same as another prepreg layer already in a prepreg stack.

Incorporating a balance region may include adding another material to the substrate (e.g., other than another prepreg layer). A balance region may comprise a polymer, a ceramic, a metal, and/or composites thereof. A balance region may include a filled polymer, and may include a second VSDM material. In some cases, a material incorporated into a balance region may be chosen to have similar thermal, elastic, mechanical, or other properties similar to those of the first region incorporating the VSDM.

In some cases, a PCB design may be characterized by an artwork compensation specification, which may be an integrated or averaged value of the artwork compensation specifications of the components (e.g., prepreg layers) from which the PCB is fabricated. In some cases, a balance region may include a material having a larger artwork compensation specification than that of the first design. In certain cases, a balance region may include a material having a larger artwork compensation specification than those of the individual prepreg layers. A balance region may include a material having a larger coefficient of thermal expansion (CTE) than that of the first region and/or the stackup associated with the first design. In certain cases, a balance region may include a material having a larger CTE than those of the individual prepreg layers. A balance region may include a material having a CTE that substantially matches that of the first region. A balance region may include a material having a shrinkage percentage (e.g., a strain associated with shrinkage or expansion due to curing) that substantially matches that of the first region. In some embodiments, a balance region comprises a second VSDM having similar properties and opposite location (in the stack) as compared to the VSDM in the first region.

A printed circuit board may include one or more prepreg layers, and may be characterized by a lack of mirror symmetry associated with a centerline. In some examples, an ESD-protected PCB may include a VSDM. An ESD-protected PCB may be characterized by a lack of mirror symmetry with respect to a centerline associated with the ESD-protected PCB and/or a centerline associated with the one or more prepreg layers.

An ESD-protected PCB may have one or more dimensionality specifications within an industry-defined specification (e.g., IEEE, IEC, IPC, ISO, and the like). Certain ESD-protected substrates (e.g., an ESD-protected PCB) may be characterized by a flatness within a tolerance such as an IPC (Association Connecting Electronics Industries) 4101A specification.

Certain aspects provide for molding a substrate comprising a VSDM. In exemplary embodiments, a flexible substrate such as a carrier foil (e.g., a thin polymer, metal, or composite substrate) is provided. A VSDM may be coated on at least a portion of the carrier foil. The coated carrier foil may be formed into a shape (e.g., using a mold). A mold may include planar, parallel plates. A mold may include other shapes, such as a cylinder, sphere, ellipsoid, and the like. A coated substrate may be processed (e.g., cured) while molded. In some cases, curing a coated substrate while in the mold may result in a demolded, cured, coated substrate "springing back" to a shape other than that of the mold. A cylindrically molded substrate (e.g., with the VSDM facing outward) may be cured, cooled and demolded to yield a substantially flat, coated, substrate. A cylinder used for molding may have a diameter between 0.25 and 20 inches, between 0.5 and 10 inches, between 1 and 8 inches, and between 2 and 5 inches.

In some embodiments, a method is contemplated for designing a printed circuit board to meet a specification. A first voltage switchable dielectric material is placed in apposition with a first copper foil. A second voltage switchable dielectric material is placed in apposition with a second copper foil. An arcuate portion of the first copper foil is placed in apposition with a first side of an aluminum member, an adhesive substance being situated between the first copper foil and the first side of the aluminum member. An arcuate portion of the second copper foil in is placed apposition with a second side of the aluminum member, an adhesive substance being situated between the second copper foil and the second side of the aluminum member.

In alternate embodiments, a method for designing a printed circuit board to meet a specification is contemplated. A first voltage switchable dielectric material is placed in apposition with a first copper foil. A second voltage switchable dielectric material is placed in apposition with a second copper foil. An arcuate portion of the first copper foil is placed in apposition with an arcuate portion of the second copper foil, an adhesive substance being situated between the first copper foil and the second copper foil.

BRIEF DESCRIPTION OF THE DRAWINGS

FIGS. 1A and 1B illustrate an exemplary unbalanced substrate (e.g., an unbalanced PCB).

FIGS. 3A, 3B, and 3C illustrate steps and structures associated with designing balanced, ESD-protected substrates, according to some embodiments.

DETAILED DESCRIPTION OF THE INVENTION

Various aspects provide for incorporating a VSDM into a substrate to create an ESD-protected substrate. In some cases, a VSDM is incorporated in a manner that results in the ESD-protected substrate meeting one or more specifications (e.g., thickness, planarity, and the like) for various subsequent processes or applications. Various aspects provide for designing a substrate (e.g., a PCB) incorporating a VSDM, and adjusting one or more aspects of the substrate to design a balanced, ESD-protected substrate. Certain embodiments include an ESD-protected substrate (e.g., incorporating a VSDM) that is mechanically and/or elastically balanced, but may not display a structural symmetry (e.g., mirror symmetry) with respect to a centerline through the substrate.

In some embodiments, a specification for a PCB is received, a VSDM is incorporated, and a balance region is incorporated into the design of the PCB to accommodate the incorporation of the VSDM while meeting the specification. Incorporating a balance region may include modifying the structure of the PCB (e.g., an order of a prepreg stackup). Incorporating a balance region may include modifying the components of the PCB (e.g., adding a polymer layer). Incorporating a balance region may include modifying the processing protocol (e.g., ramp rate, dwell time, pressure, and/or temperature associated with curing). Incorporating a balance region may include using forms, shapes, molds, and the like to mold the substrate/VSDM (or PCB) into a shape (e.g., during curing).

A VSDM may be applied as a layer to a carrier foil, which may be a polymer, a metal, a ceramic, a composite, and the like. A VSDM may be applied to a wafer, package, printed circuit board (PCB), printed wiring board (PWB), and the like. For the purposes of this specification, PCB may generally describe a substrate into which a VSDM may be incorporated.

Figure 2A:
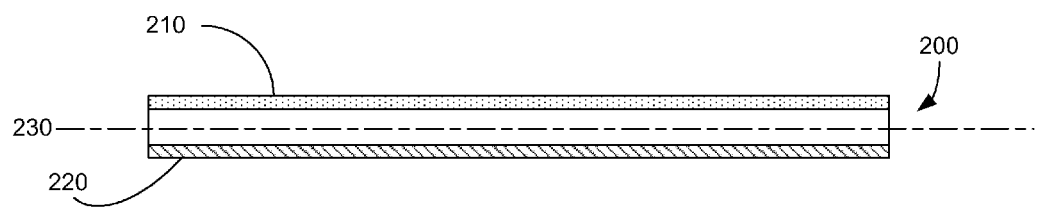
FIGS. 2A and 2B schematically illustrate a balanced substrate incorporating a VSDM, according to some embodiments.
Figure 2B:
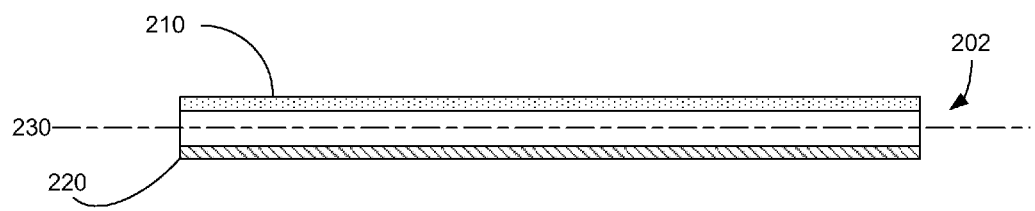

FIGS. 2A and 2B schematically illustrate a balanced substrate incorporating a VSDM, according to some embodiments. Balanced PCB 200 includes a first region 210 incorporating a VSDM. In this example, first region 210 includes a VSDM disposed as a substantially planar layer, which in some cases may be between 0.2 and 5 mils thick, or between 1 and 3 mils thick. A first region may include a VSDM disposed in other geometries (e.g., lines, traces, and other volumes).

A balance region may include a portion of the substrate whose incorporation into the design balances one or more forces induced or associated with the VSDM (e.g., during subsequent processing). A balance region may include one or more additional layers of prepreg. A balance region may include another material (e.g., a polymer, a filled polymer, a VSDM, a resin layer, a reinforcement layer, and the like). A balance region may be characterized by the removal of a layer from the design. A balance region may be planar, and may include shapes other than planer.

In some embodiments, a balance region may be associated with a PCB stackup. Many typical PCB stackups (not incorporating a VSDM) are balanced. A PCB stackup incorporating a balance region may appear "imbalanced" with respect to a centerline, particularly when the inclusion of the VSDM is not accounted for (i.e., the PCB stack, ex-VSDM, may appear unbalanced). Concomitant incorporation of a first region comprising a VSDM and a balance region may result in a balanced PCB design, notwithstanding an apparent imbalance in the PCB stack ex-VSDM. Balanced PCB 200 may include a balance region 220.

In the example shown in FIGS. 2A and 2B, first region 210 may include a VSDM having a larger coefficient of thermal expansion (CTE) than that of other portions of the substrate other than balance region 220. Balance region 220 may have a similar (or the same) CTE as that of first region 210. In this example, first region 210 is disposed above centerline 230, and balance region 220 is disposed below (on the other side of) centerline 230. When first region 210 and balance region 220 have the same CTE, they may be disposed the same distance from centerline 230. When balance region 220 has a smaller CTE than that of first region 210, it may be disposed farther from centerline 230 (and vice versa).

FIG. 2B is a schematic illustration of a processed PCB. In this example, PCB 200 may be processed to form processed PCB 202. Processing may include heating, exposing to light, depositing, etching, ashing, pressing, curing, cutting, engraving, drilling, plating, soldering re-flowing, and the like. Processing may include attaching one or more components, such as resistors, capacitors, inductors, and the like. Processing may include attaching a chip, a package, a system-in-package (SIP), system-on-chip (SOC), and the like.

Processed PCB 202 may meet one or more specifications, such as thickness, flatness, size, thermal properties, dielectric properties, and the like. Some specifications may be standardized, (e.g., by a standards-setting organization), such as ISO, IEEE, IEC, IPC, JEDEC and the like. In some embodiments, a substrate (which may incorporate a VSDM layer) may meet a flatness standard, such as IPC-4101A.

FIGS. 3A, 3B, and 3C illustrate steps and structures associated with designing balanced, ESD-protected substrates, according to some embodiments. A substrate designed for an application may be defined by one or more specifications. In this example, a first substrate design 300 may be a PCB, and may include one or more prepreg layers 310. In some cases, a prepreg stackup may be specified, which may result in a design that includes a centerline 320. In some cases, external properties (e.g., a desired thickness 312) may be specified.

FIG. 3B schematically illustrates a design (that may be unbalanced) for an ESD-protected substrate. ESD-protected substrate design 302 includes a first region 330 that includes a VSDM. A VSDM may (inter alia) protect various circuits attached to the substrate. Protection may include protection against spurious electrical events, such as electrostatic discharge (ESD). For the purposes of this specification, a substrate incorporating a VSDM may be described as an ESD-protected substrate.

FIG. 3C illustrates a balanced, ESD-protected substrate design. In this example, a balanced ESD-protected substrate design 304 includes a first region 330 having a VSDM and a balance region 340. Balance region 340 may "balance" or otherwise counteract various undesirable effects associated with the incorporation of first region 330. Representative, non-limiting effects may include warpage induced by curing the VSDM, dimensional changes associated with CTE mismatch between the first region and other portions of the substrate, and the like. Balanced, ESD-protected substrate design 304 may not display mirror symmetry with respect to centerline 320.

A design may be modified to incorporate a balance region by calculating or otherwise estimating the effects of incorporation of the first region (e.g., the VSDM) on subsequent processing steps. For example, a shrinkage associated with curing of a VSDM may be measured on a test coupon. For a given thickness of VSDM (incorporated into a PCB design), VSDM properties, and associated process of the other materials in the PCB (e.g., prepreg), an expected effect may be calculated (e.g., using a rule of mixtures law and associated geometrical factors). In the example shown in FIG. 3C, the effect of incorporating a first region 330 (e.g., having a first curing shrinkage or first CTE) located a first distance 332 from centerline 320, may be calculated using the stackup geometry and associated properties of the stackup materials. Using computer simulation of one or more possible modifications to the unbalanced design, a type of layer having an appropriate combination of balance region parameters may be chosen that results in a balanced ESD-protected design. For example, designs having layers of different CTE values, thicknesses, distances 342, curing shrinkages, and the like may be simulated (e.g., using Finite Element Modeling of the design to predict properties), and a combination resulting in a balanced ESD-protected substrate may be selected. In some cases, a large number of pseudorandomly selected designs may be simulated (e.g., using Monte-Carlo simulation) and those resulting in the best match to desired properties may be selected.

In an exemplary calculation, a first design may include a first prepreg stackup. A planar first region incorporating a VSDM may be incorporated into the design. In some cases, a thickness, location, switching voltage, shape, and other properties of the first region may be at least partially determined by desired electrical properties (e.g., location of vias, lines, chips, and the like). An expected result of the incorporation may be calculated based on properties of the first region and properties of the prepreg stackup. Exemplary expected results include an expected warpage associated with curing the VSDM or expected warpage associated with cooling of a cured substrate from a higher temperature to room temperature. A balance region may be identified by simulating the addition, subtraction, (and/or both) of additional prepreg layers (and the corresponding effect on final properties). A "goodness of fit" parameter may be maximized such that a simulation is chosen that is most likely to result in desired properties. For example, a plurality of randomly selected additions/subtractions of prepreg layers may be simulated, and those that are most expected to result in a flat substrate after curing and cooling may be chosen. In some embodiments, desired properties (e.g., elastic moduli, curing shrinkage, CTE, thickness, location) of a balance region may be solved for analytically, and an appropriate material having such properties may be chosen and designed into the appropriate location or locations.

Figure 4A:
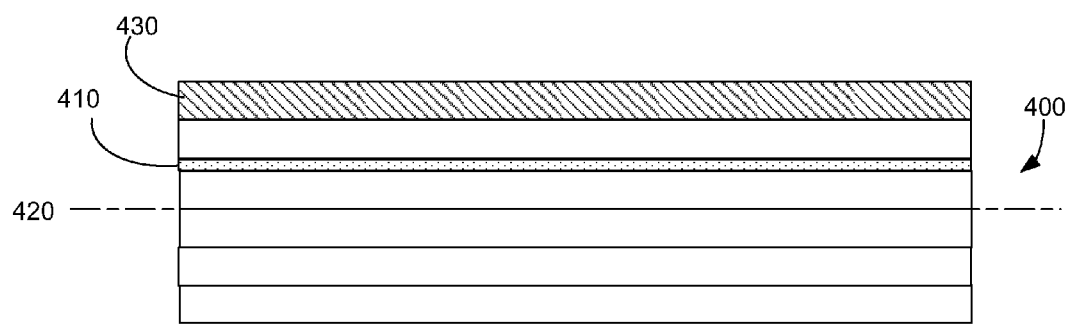
FIGS. 4A, 4B, and 4C schematically illustrate several different balance regions, according to some embodiments.
Figure 4B:
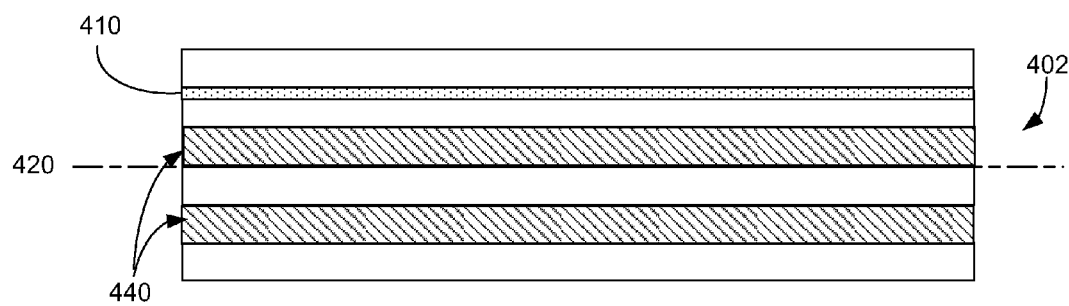
Figure 4C:
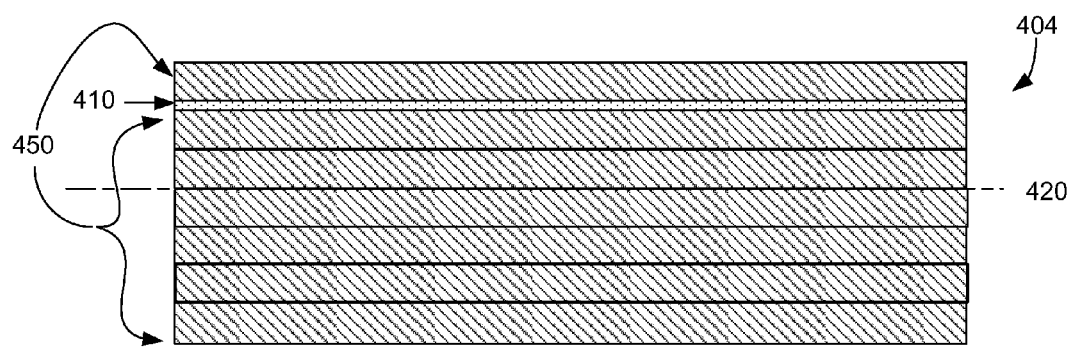

FIGS. 4A, 4B, and 4C schematically illustrate several different balance regions, according to some embodiments. FIG. 4A illustrates a balanced, ESD-protected design for a PCB 400. PCB 400 includes a first region 410 having a VSDM, located on a first side of a centerline 420. A balance region 430 may be at least partially disposed on the same side of the centerline as first region 410. Exemplary balance region 430 may be characterized by a curing shrinkage lower than that of various prepreg layers. Exemplary balance region 430 may have a higher, lower, or similar elastic modulus than that of various prepreg layers.

FIG. 4B illustrates a balanced, ESD-protected design for a PCB 402. PCB 402 includes a first region 410, having a VSDM, located on a first side of a centerline 420. In this example, balance region 440 is partially disposed on an opposite side of the centerline and partially disposed on the same side of the centerline as first region 410.

FIG. 4C illustrates a balanced, ESD-protected design for a PCB 404. PCB 404 includes a first region 410, having a VSDM, located on a first side of a centerline 420. In this example, substantially the entire PCB stackup has been redesigned (e.g., replaced with different prepreg layers) to balance the incorporation of first region 410. Balanced, ESD-protected substrates 400, 402, and 404 may not display mirror symmetry with respect to centerline 420.

Figure 5:
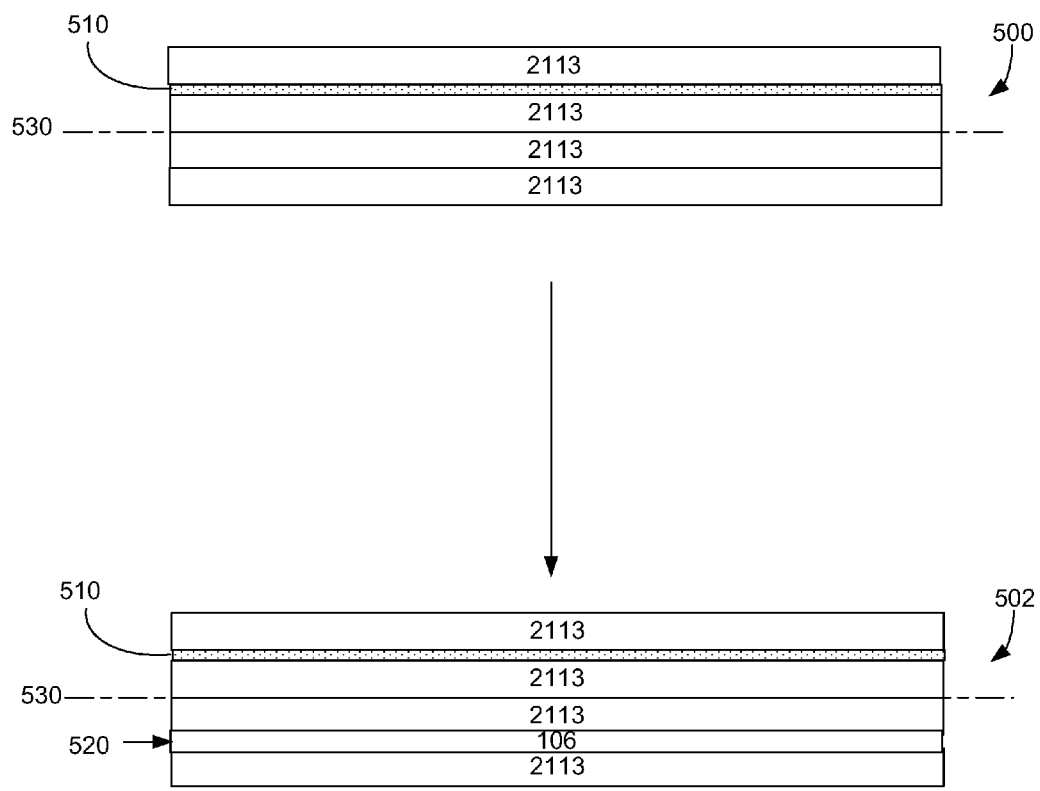
FIG. 5 illustrates an incorporation of a balance region into a PCB design, according to some embodiments.

FIG. 5 illustrates an incorporation of a balance region into a PCB design, according to some embodiments. FIG. 5 illustrates an exemplary incorporation that includes adding a prepreg layer. In this example an ESD-protected substrate 500 may include a first region 510 having a VSDM. In this example, the substrate includes a stack of four style-2113 prepreg layers, with the first region disposed as shown. ESD-protected substrate 500 may be unbalanced.

The design for ESD-protected substrate 500 may be modified to create a design for a balanced, ESD-protected substrate 502. In this example, balanced ESD-protected substrate 502 includes a balance region comprising an additional layer 520 of style 106 prepreg, inserted on the opposite side of the centerline (with respect to first region 510). In this example, additional layer 520 is inserted between the two layers of style 2113 prepreg, opposite the first region 510.

Certain embodiments include adjusting a type associated with a balance region (e.g., a type of prepreg layer). A type may be a multivariable descriptor of one or more (and in some cases, many) characteristics of a material such as a prepreg layer. Type may include a style and/or other parameters characterizing a layer, such as reinforcement (e.g., E-glass), resin type (e.g., epoxy), additional resins (e.g., multistage resins), halogen concentration, curative type, resin content, catalyst, resin filler type and loading, Tg, CTE, permittivity, loss, dielectric constant, modulus, and the like. In some cases, a type may include a standard characteristic (e.g., a style) modified and annotated to further define characteristics (e.g., a halogen-free, two-stage resin of style 106 having a high Tg). Choosing a type may include choosing appropriate prepreg parameters (e.g., resin composition, resin content, filler composition, filler content, curing kinetics, and the like).

Balanced ESD-protected PCB 502 may not display mirror symmetry with respect to the centerline 530, which may be located at a mid-point of the substrate (including the first region 510) or a mid-point of the PCB-stack (not including the first region 510). In some embodiments, the removal of one or more layers of prepreg, to rebalance an imbalanced PCB, may be described as the incorporation of a balance region.

Figure 6:
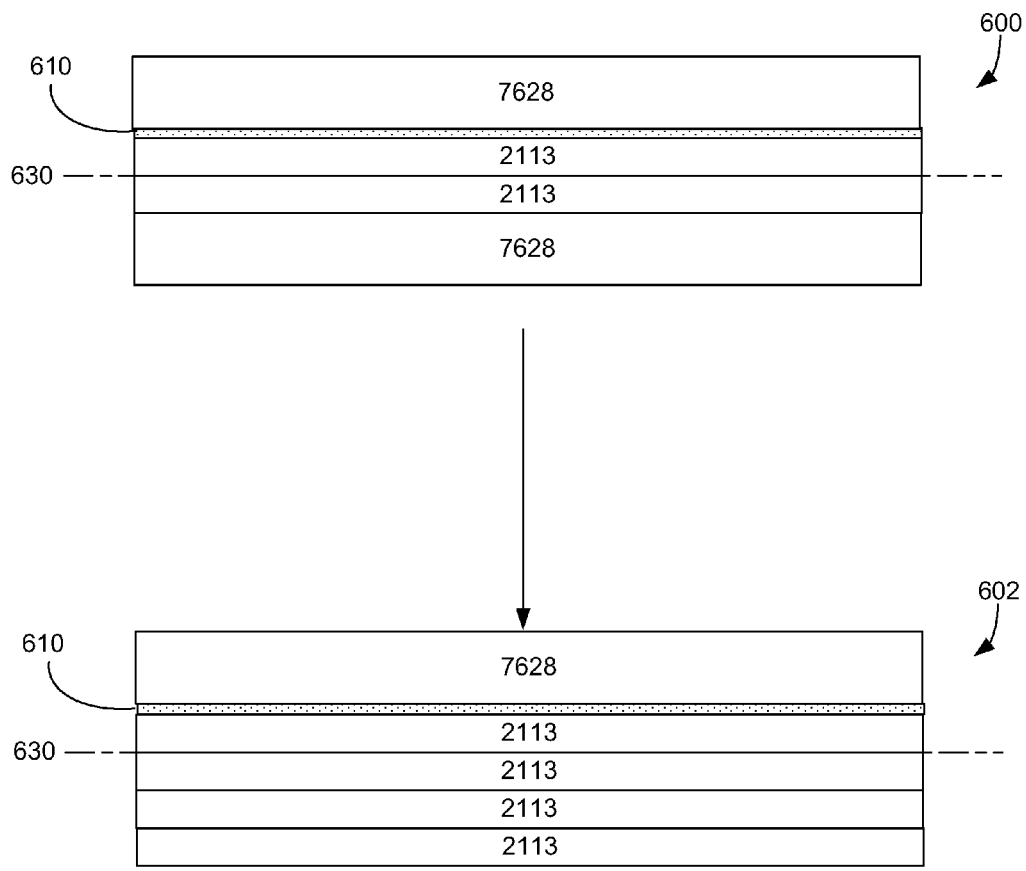
FIG. 6 illustrates an incorporation of a balance region into a PCB design, according to some embodiments.

FIG. 6 illustrates an incorporation of a balance region into a PCB design, according to some embodiments. In this exemplary incorporation, a first prepreg layer is removed and a second prepreg layer is added to a design. ESD-protected PCB 600 includes a first region 610 comprising a VSDM. Excluding the first region 610, the design includes four prepreg layers, layered in styles 7628-2113-centerline-2113-7628. First layer 610 is disposed between the upper 7628 and 2113 prepreg layers. The design for ESD-protected PCB 600 may be unbalanced.

Balanced ESD-protected PCB 602 includes a different prepreg stacking than that of ESD-protected PCB 600. An aspect of this difference may be described as a difference in prepreg layers on the opposite side of first region 610. In this example, the opposite layer of style 7628 prepreg has been swapped for two layers of style 2113 prepreg, resulting in a balanced, ESD-protected PCB. Balanced ESD-protected PCB 602 may not display mirror symmetry with respect to the centerline 630, which may be located at a mid-point of the substrate (including the first region 610) or a mid-point of the PCB-stack (not including the first region 610).

Figure 7:
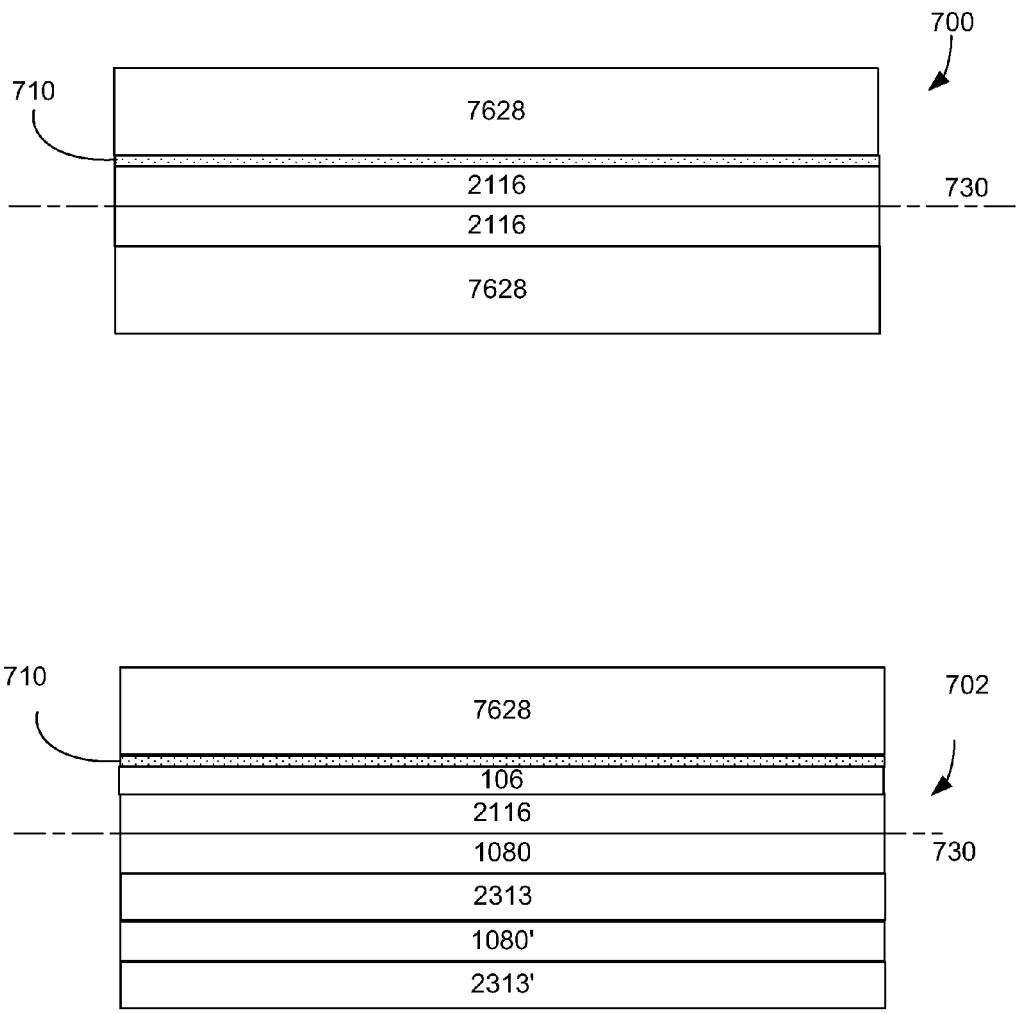
FIG. 7 illustrates an incorporation of a balance region into a PCB design, according to some embodiments.

FIG. 7 illustrates an incorporation of a balance region into a PCB design, according to some embodiments. ESD-protected PCB 700 includes a first region 710 comprising a VSDM. Excluding the first region 710, the design includes four prepreg layers, layered in styles 7628-2116-centerline-2116-7628. First layer 710 is disposed between the upper 7628 and 2116 prepreg layers. The design for ESD-protected PCB 700 may be unbalanced.

Balanced ESD-protected PCB 702 includes a different prepreg stacking than that of ESD-protected PCB 700. Differences include an addition of a prepreg layer on the same side as first region 710, a swapping of prepreg layers on the opposite side of the centerline, and a change in grain orientation of prepreg layers.

In this example, an additional prepreg layer style 106 is added between first region 710 and adjacent prepreg layer style 2116. On the opposite side of the centerline, the styles 2116 and 7628 prepreg layers have been replaced with styles 1080, 2313, 1080', and 2313' in a stacking as shown. In this example, styles 1080 and 1080' have different grain orientations, and styles 2313 and 2313' have different grain orientations. Balanced ESD-protected PCB 702 may not display mirror symmetry with respect to the centerline 730, which may be located at a mid-point of the substrate (including the first region 710) or a mid-point of the PCB-stack (not including the first region 710).

Figure 8:
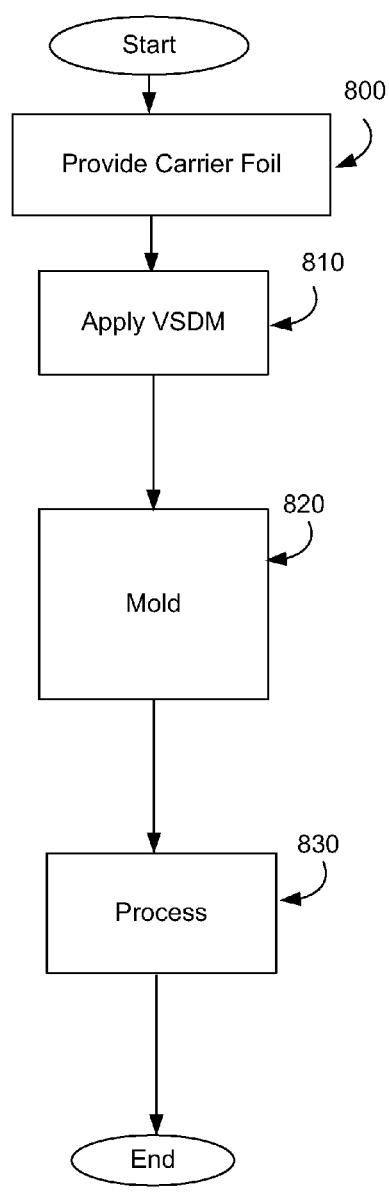
FIGS. 8 and 9 illustrate a method and associated structures, according to some embodiments.
Figure 9:
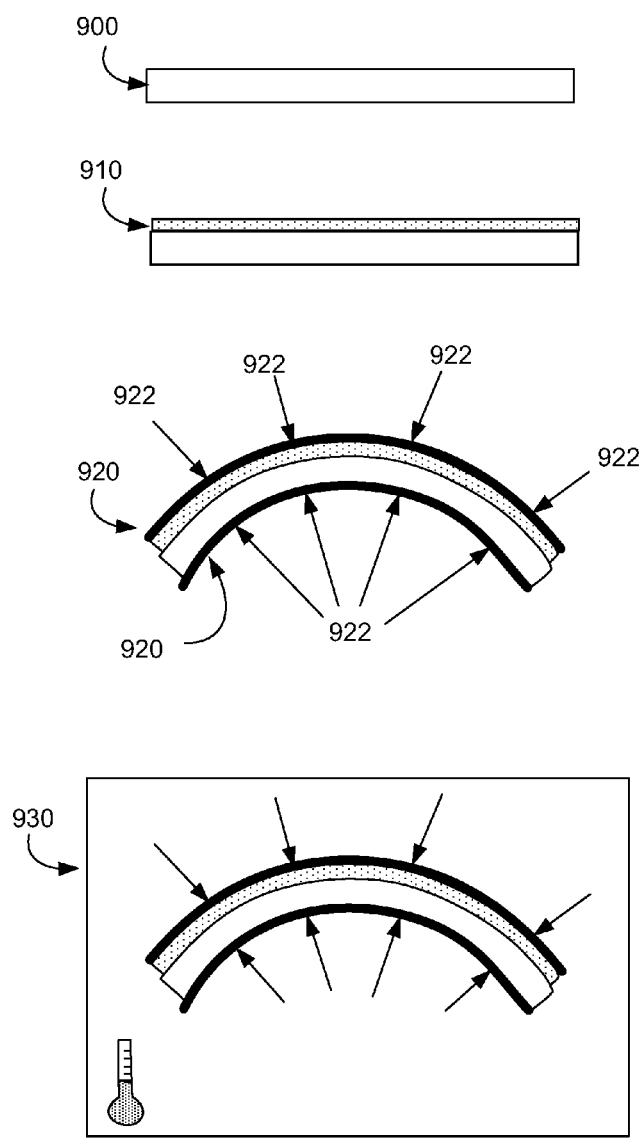

FIGS. 8 and 9 illustrate a method and associated structures, according to some embodiments. FIG. 8 illustrates a method for processing a substrate comprising a VSDM. FIG. 9 illustrates exemplary associated structures.

A carrier foil 900 is provided in step 800. In step 810, a VSDM 910 may be applied to (e.g., coated on) at least a portion of the carrier foil 900. In step 820, the coated carrier foil may be shaped or formed using a mold 920. In some embodiments, an optional drying step may be performed on the coated carrier foil to dry and/or partially cure the VSDM. Molding may include the use of pressure 922. Pressure may be applied via an external component (e.g., mold 920). Pressure may be applied via internally-generated elastic forces. For example, a coated carrier foil may be wrapped around a cylinder. For situations in which the carrier foil has a much higher elastic modulus than that of the VSDM, the VSDM may be constrained to (and sheared by) the shape and size of the carrier foil. A mold may be any shape, including flat (e.g., planar, parallel plates), cylindrical, spherical, hyperbolic, ellipsoidal, parabolic, angled, and other shapes.

In step 830, the coated carrier foil is processed. In some cases, processing may include heating the coated carrier foil to a temperature, which may be performed in an oven 930. In some cases, pressure 922 may be maintained during processing. Processing may include curing, drying, post-cure treatments, exposure to light (e.g., ultraviolet light), vibration, ultrasonication, application of pressure or other forces, bending, stretching, clamping, and the like. In some embodiments, a coated carrier foil may be wrapped around a cylinder (e.g., with the VSDM facing outward), and the wrapped cylinder may be placed in an oven and heated to a curing temperature associated with the VSDM. A residual contraction of the cured VSDM/carrier foil composite (e.g., upon cooling and demolding) may yield a substantially planar carrier foil having a cured VSDM layer thereon.

Some embodiments include adjusting a formulation of a VSDM, which may include changing an epoxy (e.g., type, ratio), curative agent (e.g., type, ratio to epoxy or resin), and/or the addition of other additives to improve balance. Exemplary epoxies include Epon 828, GP611, Polybd, and the like. Exemplary curative agents include Dicyandiamide, Diaminodiphenylsulfone, Nadic methyl anhydrides, and the like.

A first region having a VSDM may consist of the VSDM. A first region may comprise a VSDM and another substance (or gaps, holes, and the like). A first region may be uniform (e.g., planar). A first region may include discrete elements (e.g., disks, lines, wires, and the like).

Figure 10:
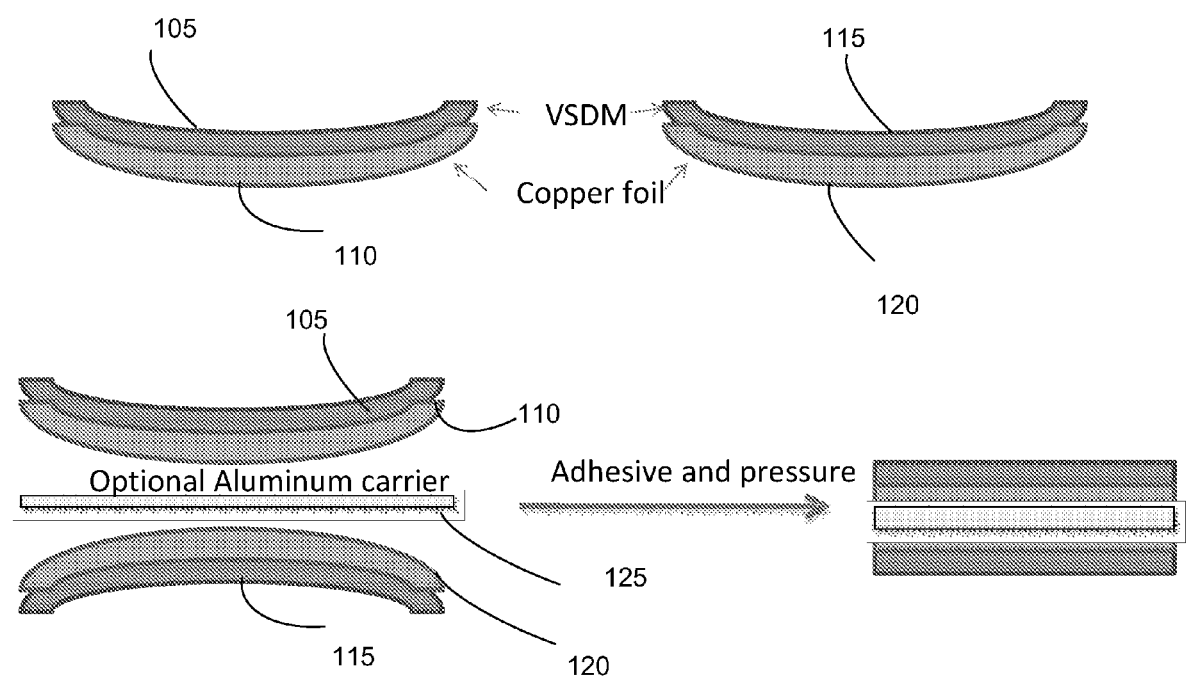
FIG. 10 illustrates the method of reducing curl.

FIG. 10 illustrates the method of reducing curl. A method for designing a printed circuit board to meet a specification is contemplated. A first voltage switchable dielectric material 105 is placed in apposition with a first copper foil 110. A second voltage switchable dielectric material 115 is placed in apposition with a second copper foil 120.

"Curl" is seen when VSDM is applied or coated to copper as the copper and VSDM becomes curved during curing. An arcuate portion of the first copper foil 110 is placed in apposition with a first side of an aluminum member 125 or carrier. An adhesive substance is situated between the first copper foil 110 and the first side of the aluminum member 125. An arcuate portion of the second copper foil 120 is placed in apposition with a second side of the aluminum member 125. An adhesive substance is situated between the second copper foil 120 and the second side of the aluminum member 125. Pressure may then be applied to reduce the curl. The pressure may be applied to the first and second voltage switchable dielectric materials. Stress is balanced by the pressure and adhesive so that the first and second voltage switchable dielectric materials, as well as the first and second copper foils, are urged to a planar or flat configuration. An ESD-protected design may then be produced as described herein. In some embodiments the aluminum member 125 is not used and the first copper foil 110 is glued to the second copper foil 120.

Some embodiments include sensors to sense various parameters (e.g., thickness, strain, temperature, stress, viscosity, concentration, depth, length, width, thickness, number of layers, coefficient of thermal expansion (CTE), switching voltage and/or voltage density (between insulating and conducting), trigger voltage, clamp voltage, off-state current passage, dielectric constant, time, date, and other characteristics). Various apparatus may monitor various sensors, and systems may be actuated by automated controls (solenoid, pneumatic, piezoelectric, and the like). Some embodiments include a computer readable storage medium coupled to a processor and memory. Executable instructions stored on the computer readable storage medium may be executed by the processor to perform various methods described herein. Sensors and actuators may be coupled to the processor, providing input and receiving instructions associated with various methods. Certain instructions provide for closed-loop control of various parameters via coupled sensors providing input and coupled actuators receiving instructions to adjust parameters. Certain embodiments include materials. Various embodiments include telephones (e.g., cell phones), USB-devices (e.g., a USB-storage device), personal digital assistants, laptop computers, netbook computers, tablet PC computers and the like.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A method for manufacturing a printed circuit board (PCB), the method comprising:
   coating a voltage switchable dielectric material on a copper foil;
   curing the voltage switchable dielectric material;
   forming an arcuate portion of the copper foil from the curing; and
   attaching the arcuate portion of the copper foil to a layer of the PCB.

2. The method of claim 1, further comprising:
   coating a second voltage switchable dielectric material on a second copper foil;
   curing the second voltage switchable dielectric material;
   forming an arcuate portion of the second copper foil from the curing; and
   attaching the arcuate portion of the second copper foil to a layer of the PCB.

3. The method of claim 2, further comprising applying pressure to the first and second voltage switchable dielectric materials.

4. The method of claim 3, wherein applying pressure to the first and second voltage switchable dielectric materials renders the first and second voltage switchable dielectric materials into a planar configuration.

5. The method of claim 1, further comprising choosing a first design for a printed circuit board comprising one or more prepreg layers.

6. The method of claim 1, further comprising creating an electrostatic discharge (ESD)-protected design.

* * * * *